US008685596B2

(12) United States Patent
Gao et al.

(10) Patent No.: US 8,685,596 B2
(45) Date of Patent: Apr. 1, 2014

(54) SEMI-TRANSPARENT FILM GRAYSCALE MASK (75) Inventors: Wei Gao, Vancouver, WA (US); Bruce D. Ulrich, Beaverton, OR (US); Yoshi Ono, Camas, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 893 days.

(21) Appl. No.: 11/950,196

(22) Filed: Dec. 4, 2007

(65) Prior Publication Data
US 2009/0142673 A1 Jun. 4, 2009

(51) Int. Cl.
G03F 1/00 (2012.01)

(52) U.S. Cl.
USPC ............................................................ 430/5

(58) Field of Classification Search
USPC ............................................................ 430/5
See application file for complete search history.

(56) References Cited

U.S. PATENT DOCUMENTS

| | | | | |
|---|---|---|---|---|
| 5,334,467 A * | 8/1994 | Cronin et al. | | 430/5 |
| 5,786,114 A * | 7/1998 | Hashimoto | | 430/5 |
| 5,972,543 A * | 10/1999 | Yokoyama et al. | | 430/5 |
| 6,165,692 A * | 12/2000 | Kanai et al. | | 430/311 |
| 6,709,791 B1 * | 3/2004 | Mohri et al. | | 430/5 |
| 6,846,729 B2 * | 1/2005 | Andoh et al. | | 438/534 |
| 2002/0197544 A1 * | 12/2002 | Iwasaki | | 430/5 |
| 2005/0112477 A1 * | 5/2005 | Yoshikawa et al. | | 430/5 |
| 2006/0269849 A1 * | 11/2006 | Lee | | 430/5 |
| 2008/0131790 A1 * | 6/2008 | Chang et al. | | 430/5 |
| 2008/0254376 A1 * | 10/2008 | Lin et al. | | 430/5 |
| 2009/0220867 A1 * | 9/2009 | Fujikawa et al. | | 430/5 |

FOREIGN PATENT DOCUMENTS

WO   WO 2007034930 A1 *   3/2007

* cited by examiner

*Primary Examiner* — Jonathan Jelsma
(74) *Attorney, Agent, or Firm* — Law Office of Gerald Maliszewski; Gerald Maliszewski (57) ABSTRACT A grayscale mask made from semi-transparent film layers is provided, along with an associated fabrication method. The method provides a transparent substrate, such as quartz, with a surface. A first layer of a semi-transparent film having a surface with a first surface area, is formed overlying the substrate surface. At least a second layer of the semi-transparent film having a surface with a second surface area greater than the first surface area, is formed overlying the first layer. A first vertical region is formed having a light first attenuation parameter through the combination of substrate, first layer, and second layer. A second vertical region is formed having a light second attenuation parameter through the combination of the first layer and substrate, and a third vertical region is formed having a light third attenuation parameter through the substrate.

26 Claims, 7 Drawing Sheets

SEMI-TRANSPARENT FILM GRAYSCALE MASK

BACKGROUND OF THE INVENTION

1. Field of the Invention

This invention generally relates to integrated circuit (IC) fabrication and, more particularly, to a grayscale mask comprised of multiple semi-transparent film layers, and to an associated mask fabrication process.

2. Description of the Related Art

Grayscale masks or reticles are used to expose light-sensitive photoresist (PR) or resin materials. Based upon light exposure, PR films can be formed as temporary masks for the purpose of selectively etching IC films, or for directly patterning the desired shape into a resin. Grayscale and PR masks have application in the fabrication of image sensors, displays, microelectromechanical systems (MEMS), and optical devices to name a few. One proven method of making a grayscale mask is to use e-beam lithography, where a high-energy-beam-sensitive (HEBS) material is exposed by e-beam, and the attenuating factor of the material is related to the electron dose. However, e-beam lithography is a very slow and expensive process, especially for large size structures, which often makes this approach economically unaffordable.

It would be advantageous if a grayscale mask could be fabricated using conventional thin-film IC deposition/photo/etching/ashing steps.

It would be advantageous if a grayscale mask could be fabricated using patterned layers of thin semi-transparent film as a light attenuating material.

SUMMARY OF THE INVENTION

A method is disclosed for fabricating a grayscale mask by using thin films. For example, a semi-transparent film (e.g., titanium, chromium oxide, $MoSi_2$, or chromium nitride), is deposited on a silicon (Si) or quartz substrates and patterned by using conventional photolithographic methods in a reticle fabrication facility. After multiple cycles of deposition/patterning/etching/ashing processes, a grayscale mask is formed that attenuates light differently in different zones, depending upon the accumulated total film thickness. The completed grayscale mask, if formed on a wafer, can be transferred onto a quartz reticle plate by a number of different wafer bonding technologies. Titanium (Ti) is one metal that may be used in fabricating the grayscale mask, however, other metals and non-metallic films with similar characteristics may also be used.

Accordingly, a method is provided for forming a grayscale mask from semi-transparent film layers. The method provides a transparent substrate, such as quartz, with a surface. A first layer of a semi-transparent film having a surface with a first surface area, is formed overlying the substrate surface. At least a second layer of the semi-transparent film having a surface with a second surface area greater than the first surface area, is formed overlying the first layer.

The transparent substrate has a light first transmission characteristic, while the first and second layers of semi-transparent film have a light second transmission characteristic, less than the first transmission characteristic. As a result, a first vertical region is formed having a light first attenuation parameter through the combination of substrate, first layer, and second layer. A second vertical region is formed having a light second attenuation parameter through the combination of the first layer and substrate, and a third vertical region is formed having a light third attenuation parameter through the substrate. In addition, the first and second layers of semi-transparent film have light transmission characteristics responsive to the film thicknesses. Typically, the first and second layers of semi-transparent film each have thicknesses in the range of 0.1 to 50 nanometers (nm).

The first layer of semi-transparent film is formed by conformally depositing the first layer of semi-transparent film, forming a photoresist pattern overlying the first layer, and etching exposed regions of the first layer. The other layers of semi-transparent film are formed in a similar manner. Some examples of semi-transparent films include Ti, V, Cr, Co, Ni, Zr, Nb, Mo, Tc, Ru, Rh, Pd, Ag, Hf, Ta, Os, Ir, Pt, CrN, $Cr_2O_3$, $MoSi_2$, and Au.

Additional details of the above-described method and a grayscale mask of semi-transparent film layers are provided below.

DETAILED DESCRIPTION

Figure 1:
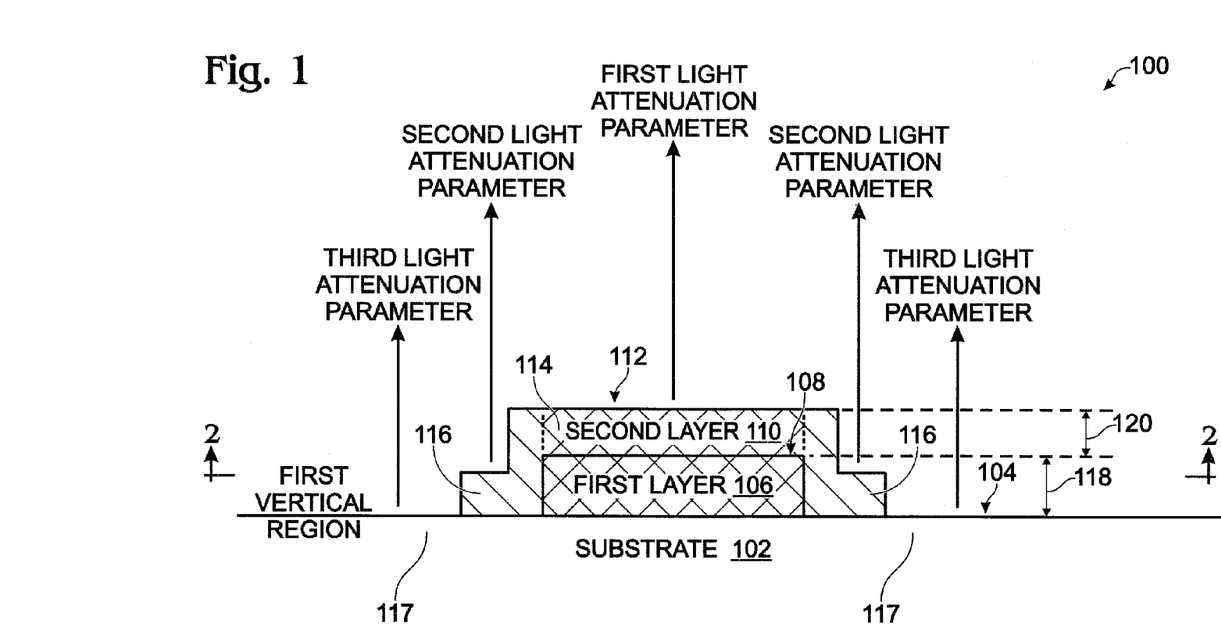
FIG. 1 is a partial cross-sectional view depicting a grayscale mask of semi-transparent film layers.

FIG. 1 is a partial cross-sectional view depicting a grayscale mask of semi-transparent film layers. The mask 100 comprises a transparent substrate 102 with a surface 104. For example, the transparent substrate 102 may be quartz. Alternately, the substrate may be glass or plastic. A first layer 106 of a semi-transparent film has a surface 108 with a first surface area, overlying the substrate surface 104. A second layer 110 of the semi-transparent film has a surface 112 with a second surface area greater than the first surface area, overlying the first layer 106. The first and second layers of semi-transparent film 106 and 110 may metal or non-metallic materials. Some example materials include Ti, V, Cr, Co, Ni, Zr, Nb, Mo, Tc, Ru, Rh, Pd, Ag, Hf, Ta, Os, Ir, Pt, CrN, $Cr_2O_3$, $MoSi_2$, or Au. However, the mask 100 is not necessarily limited to these materials, as other semi-transparent films are known in the art. The first and second layer films are thin-films, which are formed using an IC fabrication deposition process. Some examples of thin-film deposition processes include e-beam evaporation, chemical vapor deposition (CVD), atomic layer deposition (ALD), and sputtering, to name a few examples.

Figure 2:
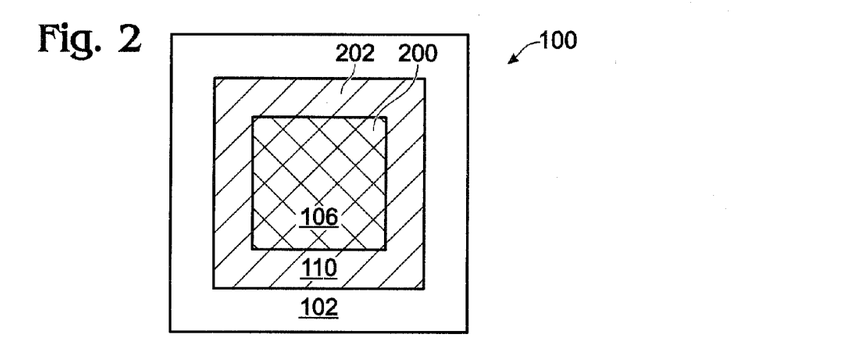
FIG. 2 is a plan view of the grayscale mask of FIG. 1.

FIG. 2 is a plan view of the grayscale mask of FIG. 1. The first surface area 200 associated with the first layer 106 is shown as double cross-hatched, while the second surface area 202 associated with the second layer 202 is shown as (single) cross-hatched.

Returning to FIG. 1, the transparent substrate 102 material has a light first transmission characteristic. The semi-transparent film material forming layers 106 and 110 has a light second transmission characteristic, less than the first transmission characteristic. That is, the semi-transparent film attenuates incident light more than the transparent substrate 102. As a result, the first and second layers of semi-transparent film form vertical regions having different light attenuation parameters. A first vertical region 114 (double cross-hatched) has a light first attenuation parameter through the combination of substrate 102, first layer 106, and second layer 110. A second vertical region 116 (cross-hatched) has a light second attenuation parameter through the combination of the second layer 110 and the substrate 102. A third vertical region 117 has a light third attenuation parameter through the substrate 102. In one aspect, the first layer 106 and second layer 110 can be made from different types of film. The different film materials may have different light transmission characteristics.

In another aspect, the light transmission characteristics of the first and second layers of semi-transparent film can be varied by modifying the film thicknesses. That is, the first layer 106 has a first thickness 118 and a light transmission characteristic responsive to the first thickness 118. Likewise, the second layer 110 has a second thickness 120 and a light transmission characteristic responsive to the second thickness 120. As a result, the light attenuation parameters through the first and second vertical regions 114 and 116 vary in response to thicknesses 118 and 120. For example, the first and second layers of semi-transparent film 106 and 110 may be Ti films, each having a thickness 118/120 in the range of 0.1 to 10 nanometers (nm). Non-metallic films typically have a thickness about 3 to 5 times greater than a metal film (e.g., Ti) thickness.

Figure 3:
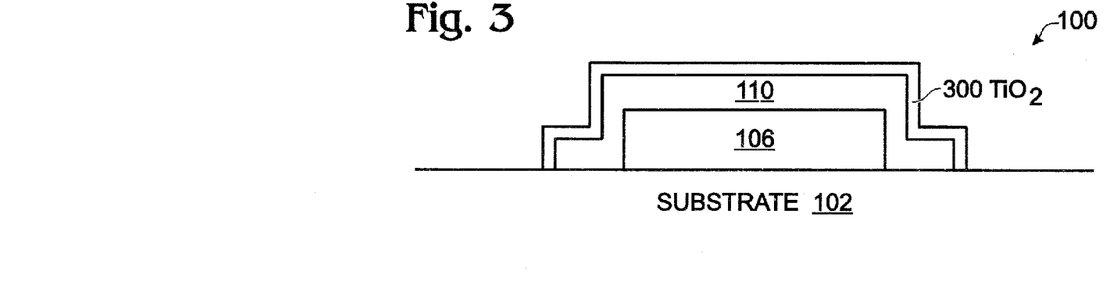
FIG. 3 is a partial cross-sectional view depicting a first variation of the mask seen in FIG. 1.

FIG. 3 is a partial cross-sectional view depicting a first variation of the mask seen in FIG. 1. In this aspect, it is assumed that the second layer of semi-transparent film 110 is Ti. A transparent $TiO_2$ passivation layer 300 overlies the second layer of Ti film 110. Alternately, the second layer of semi-transparent film may be another material, and the passivation layer 300 is an oxidized or nitrogenated layer of that underlying material.

Figure 4:
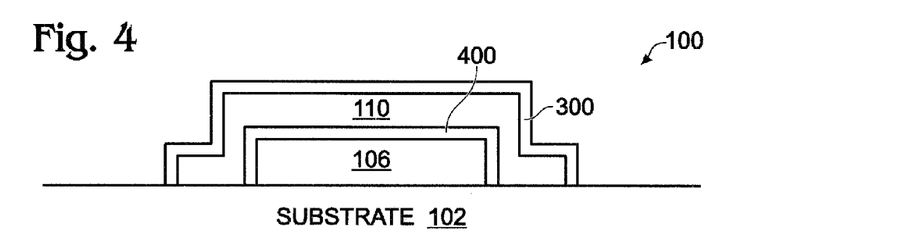
FIG. 4 is a partial cross-sectional view depicting a second variation of the mask seen in FIG. 1.

FIG. 4 is a partial cross-sectional view depicting a second variation of the mask seen in FIG. 1. In this aspect, it is assumed that the second layer of semi-transparent film 110 is Ti, and that the first layer of semi-transparent film 106 is Ti. A transparent $TiO_2$ film 400 is interposed between the first and second layers of Ti film. As above, a transparent $TiO_2$ passivation layer 300 overlies the second layer of Ti film 110. Alternately, the second layer of semi-transparent film 110 may be another material, and the passivation layer 300 is an oxidized layer of the underlying material. Likewise, the first layer of semi-transparent film may be a film other than Ti, and the film 400 is an oxidized layer of the underlying material. In some aspects (not shown), oxidation layer 400 is formed, but not oxidation layer 300. In different aspects, the underlying semi-transparent film layers are exposed to nitrogen.

Figure 5:
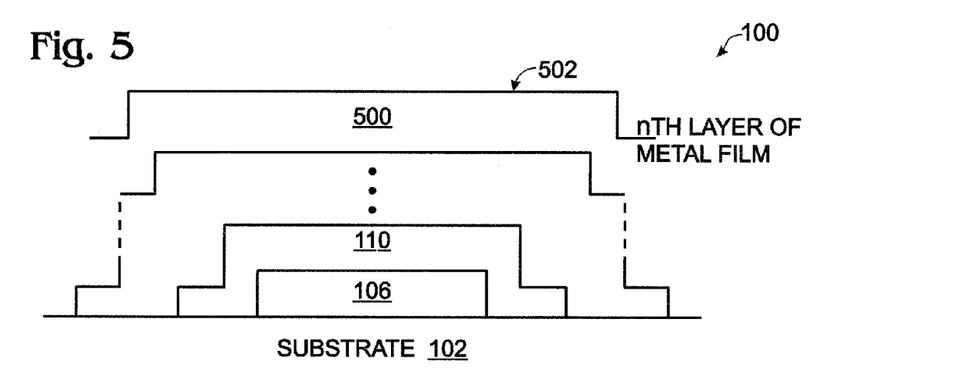
FIG. 5 is a partial cross-sectional view depicting a third variation of the mask seen in FIG. 1.

FIG. 5 is a partial cross-sectional view depicting a third variation of the mask seen in FIG. 1. (N) layers of the semi-transparent film 500 are shown, each having a surface 502 with a unique surface area, overlying the second layer 110, where n is an integer greater than or equal to 1. In this example, n=1.

Figure 6A:
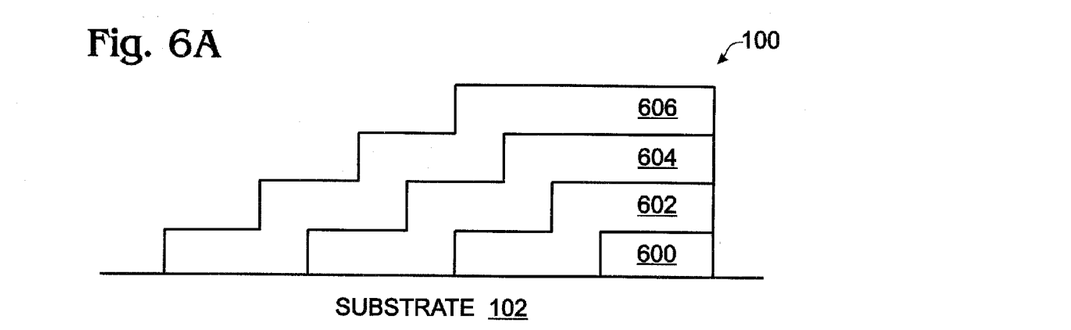
FIGS. 6A and 6B are partial cross-sectional views depicting fourth and fifth variations of the mask seen in FIG. 1.
Figure 6B:
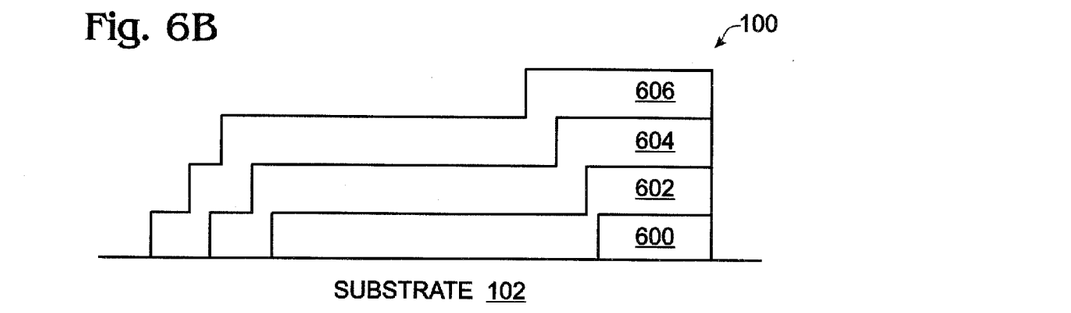

FIGS. 6A and 6B are partial cross-sectional views depicting fourth and fifth variations of the mask seen in FIG. 1. In FIGS. 1 through 5, the first and second layers of semi-transparent film form a pyramid structure. As explained in more detail below, the pyramid structure is associated with the fabrication of IC microlens. In FIG. 6A, an alternate step structure is shown with 4 layers of semi-transparent film (600, 602, 604, and 606). In FIG. 6B, an alternate ramp structure is shown with 4 layers of semi-transparent film. These structures are defined with respect to their cross-section. A step can be differentiated from a ramp in that the exposed surfaces of each semi-transparent film layer are more uniform than the ramp. It should be noted that it would be possible to form grayscale masks into many other cross-sectional shapes, other than the shapes shown in FIGS. 1 through 6B.

Although the masks in FIGS. 1 through 6B have been depicted as formed on transparent substrates, in some aspects the masks can be formed on alternate materials, such as Si, and transferred to a transparent substrate after fabrication.

Functional Description

Figure 7:
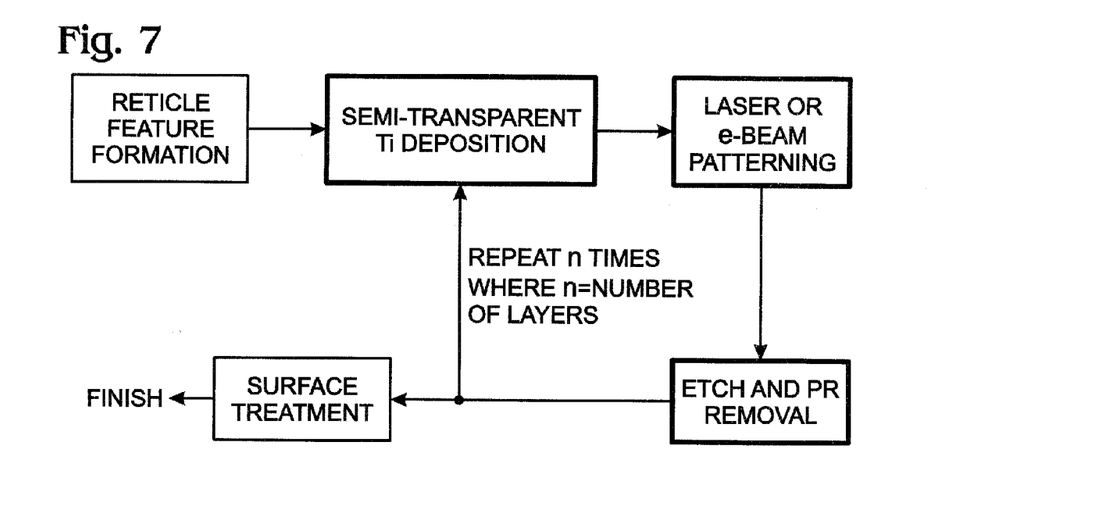
FIG. 7 is a flowchart depicting process steps in the fabrication of a Ti-based grayscale mask.

FIG. 7 is a flowchart depicting process steps in the fabrication of a Ti-based grayscale mask. Generally, the fabrication can be divided into three parts:
1. substrate preparation;
2. semi-transparent film deposition; and,
3. feature transfer to reticle plate.

The present disclosure is primarily focused on Part 2 (the darker outlined boxes in the figure), semi-transparent film deposition. Details of Part 3, feature transfer to reticle plate, can be found in related pending applications:

Method of Fabricating a Grayscale Mask USING A WAFER BONDING PROCESS, invented by Gao et al., Ser. No. 11/709,008, filed Feb. 20, 2007; and, METHOD OF FABRICATING GRAYSCALE MASK USING SMART CUT7 WAFER BONDING PROCESS, invented by Gao et al., Ser. No. 11/657,258, filed Jan. 24, 2007. Both these applications are incorporated herein by reference.

The second part of the grayscale mask fabrication process includes cycles of thin film deposition, patterning, etching, and photo-resist(PR) ashing. The patterning part of the process is discussed in related pending application METHOD OF MAKING A GRAYSCALE RETICLE USING STEP-OVER LITHOGRAPHY FOR SHAPING MICROLENSES, invented by Gao et al., Ser. No. 11/657,326, filed Jan. 24, 2007. This application is incorporated herein by reference. In the case of an array of simple round-shaped microlens, the patterning forms concentrical round shape dots with different diameters based on the design. The thickness of each layer is also pre-calculated based on the attenuating property of the material as well as the photo-response curve of the photoresist used to form the lenses.

Figure 8:
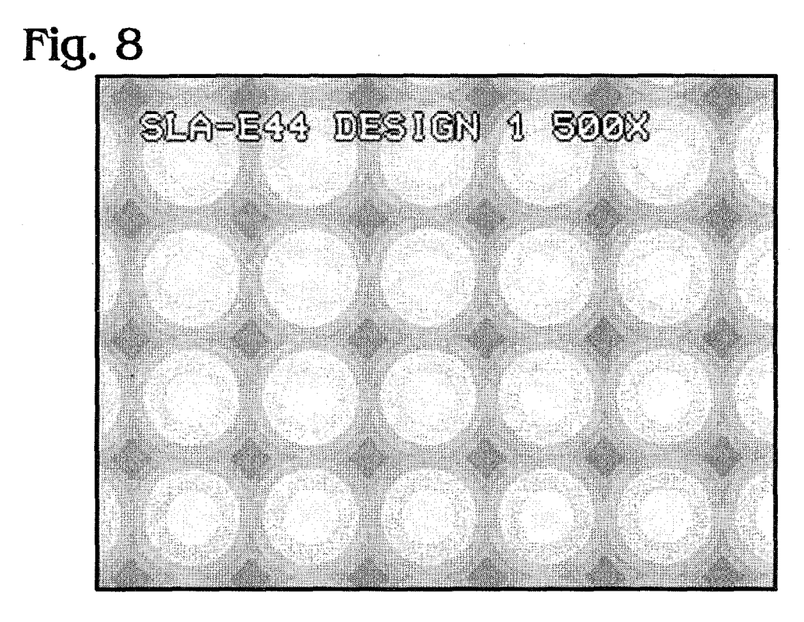
FIG. 8 is a plan view optical microscope image of a finished grayscale mask using 4 layers of semi-transparent films.

FIG. 8 is a plan view optical microscope image of a finished grayscale mask using 4 layers of semi-transparent films. The lens array is located in an evenly spaced (pitch) right angle matrix. In this example a microlens grayscale mask is made from 4 layer of 1.1 nm Ti films with different diameters. The white (center) area of each microlens is associated with the greatest light attenuation, as light pases through all 4 Ti metal layers.

Some factors that may be considered when choosing a semi-transparent film material include:

a. deposition method availability;
b. etching method availability and selectivity with underlaying materials; and,
c. physical and chemical stability during and after fabrication process.

Ti is a good metal candidate because it satisfies all three criteria mentioned above. CrN and Cr2O3 are also good candidates, since these materials materials that are used in the fabrication of conventional reticles.

Figure 9:
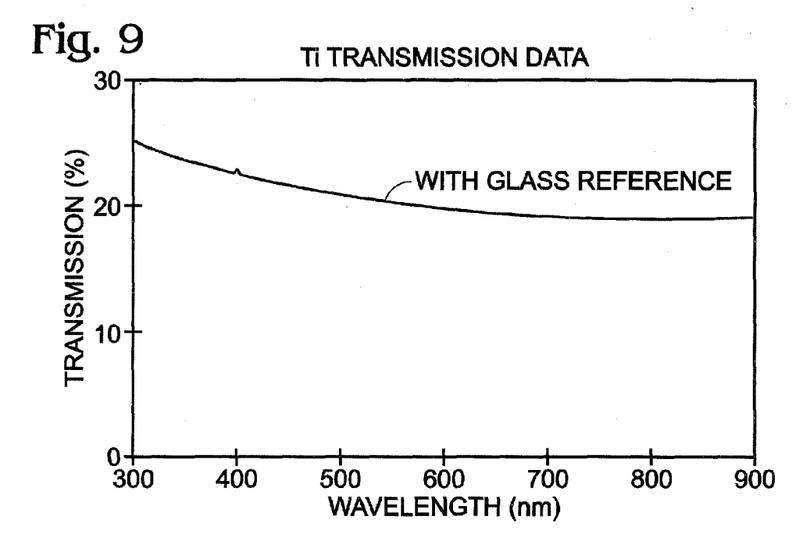
FIG. 9 is a graph depicting the tranmission characteristics of light through a Ti film at different wavelengths.

FIG. 9 is a graph depicting the tranmission characteristics of light through a Ti film at different wavelengths. A thin titanium film (<10 nm thick) offers a relatively flat transmission spectrum over the visible range, which makes Ti a good candidate for neutral density filter. For 10 nm Ti film, the transmission only varies from 23% to 19% in the visible range (400 nm-700 nm).

Figure 10:
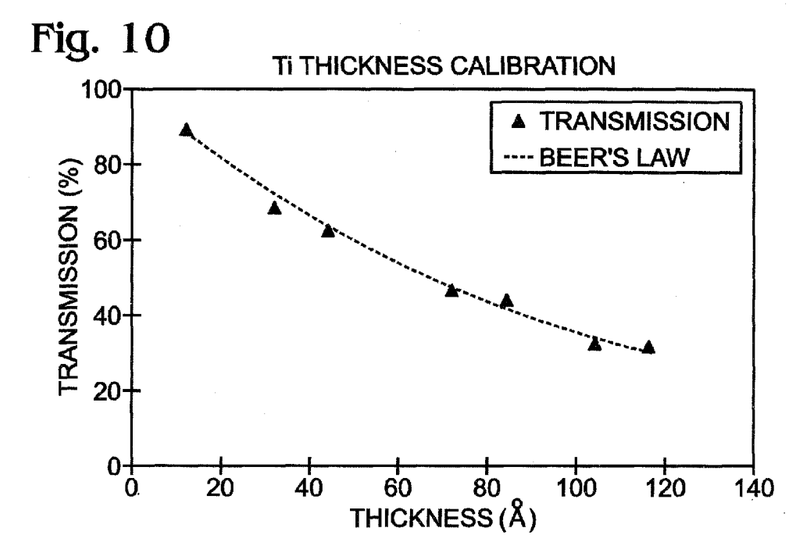
FIG. 10 is a graph showing that the transmission of light through semi-transparent Ti thin films follows Beer's law.

FIG. 10 is a graph showing that the transmission of light through semi-transparent Ti thin films follows Beer's law. The deposition method used in this study is e-beam metal evaporator (CHA). The crystal thickness monitor provides a thickness accuracy up to the angstrom level with good repeatability.

Ti also has excellent adhesion to various kind of substrates such as Si, $Si_3N_4$, and $SiO_2$. The good adhesion and etching properties are attributed to titanium's chemical activity. Also due to this activity, Ti film can be etched at room temperature in a simple solution consisting of 5% $NH_3OH$+95% $H_2O_2$. This unique etch solution provides very good selectivity between Ti and Si, $SiO_2$, $Si_3N_4$ as well as many materials, which is important to maintain high optical quality on the final grayscale masks.

Ti is easy to etch, but as a trade-off, Ti is easily attacked by chemicals and has the tendency to be oxidized when exposed to oxygen plasma. It is known that when Ti is fully oxidized into $TiO_2$, $TiO_2$ acts as a very good protection to the underlaying Ti films. In order to control the attenuating factor for the thin Ti film, the effects of deposition/oxidation may be considered.

In one experiment, the thickness of each layer of Ti in the grayscale mask is in the range from 1 to 3 nm, and the amount of extra thickness that needs to be deposited to accommodate oxidation consumption must be determined. The experiment consists of Ti layer deposition with different thicknesses, and oxidation processes in oxygen plasma with a varied number of cycles. The optical transmission measurements were performed to calculate film thickness changes.

After the deposition, the films went throught photoresist coating, exposure, and developing. These steps are conventional IC process procedures. After exposing Ti in some areas and covering some areas with PR, the wafer was exposed to oxygen plasmas (Matrix asher: 200° C. $O_2$ 2.5 torr 550 W, 2.25 min). In this step, not only is the PR removed, but the Ti surface is also oxidized. When the Ti is oxidized, a certain thickness of the Ti film is converted into transparent $TiO_2$. The thickness loss was calculated by converting the change in light transmission into a film thickness change based on Beer's law. For different Ti film thickness, the first PR ashing step consumes about 3.4 nm of Ti thickness, and the second PR ashing consumes only a few more angstroms. There is no significant Ti consumption difference detected between area of Ti exposed to the plasma and the area of Ti covered by PR in the beginning of the ashing process. This result indicates a fast decrease on oxidation rate of Ti in oxygen plasma.

From this study it can be determined that a Ti film oxidized in oxygen plasma reaches a saturated $TiO_2$ thickness after 2 steps of PR ashing. The estimated total Ti loss after two ashing processes is about 3.6 nm. Oxidized Ti forms $TiO_2$ which is a protection layer, protecting the underlying Ti from been attacked by Ti etching or further oxidation.

To test the quality of the $TiO_2$ formed in the oxygen plasma ashing process, the wafer went through two additional tests. The first test puts the wafer in a Ti etch solution (95% $H_2O_2$+ 5% $NH_3OH$) for 5 minutes, and the other test deposits 200 nm TEOS at 4000° C. The data shows that after PR ashing, the Ti film is protected by $TiO_2$ formed on top of the remaining Ti, so that no optical change is observed after 5 minutes in Ti etch solution. TEOS deposition causes light transmission to increase. This increased transmission is a result of the anti-reflection coating effect from $SiO_2$, as the refractive indexes of $TiO_2$ and TEOS $SiO_2$ are 2.5 and 1.5, respectively. By inserting TEOS in between $TiO_2$ and air, the reflection is reduced from 18% to 10%, which is very close to the 0.7 nm thickness difference observed.

Although the $TiO_2$ formed in the ashing process is good enough to protect underlying Ti from a Ti etch, it is not necessarily "strong" enough to protect Ti from a piranha clean ($H_2SO_4$ at 140° C.) or hot phosphoric etch ($H_3PO_4$ at 170° C.) due to its low formation temperature. Ti film characteristics have been used as an example. However, it should be understood that other semi-transparent film materials are similar characteristics, or characteristics that can be adapted for use in the present invention grayscale mask.

Figure 12A:
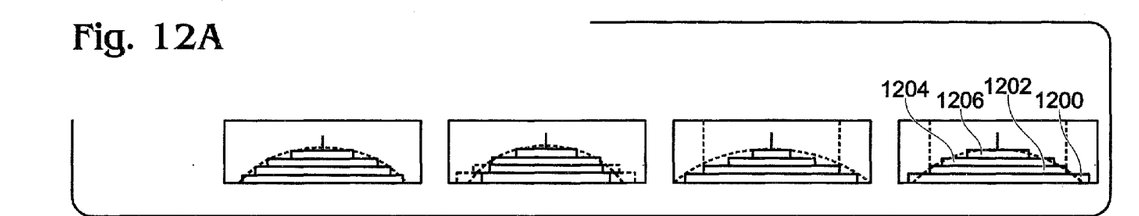
FIGS. 12A, 12B, and 12C depict cross-sectional, plan, and light transmission characteristics, respectively, of a family of microlens (pyramid shaped) grayscale masks.
Figure 12B:
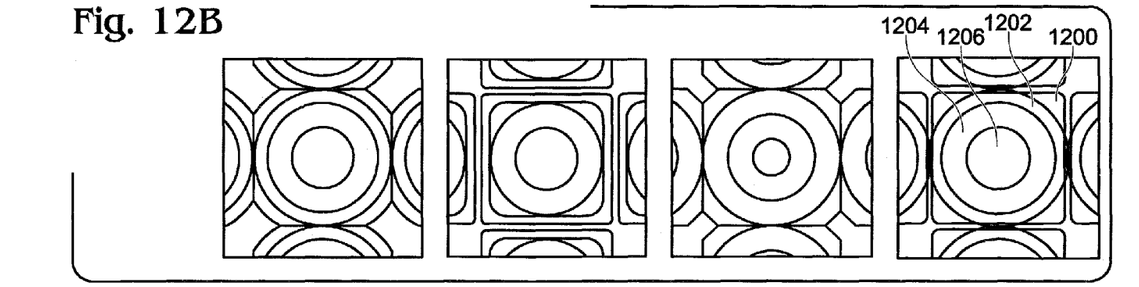
Figure 12C:
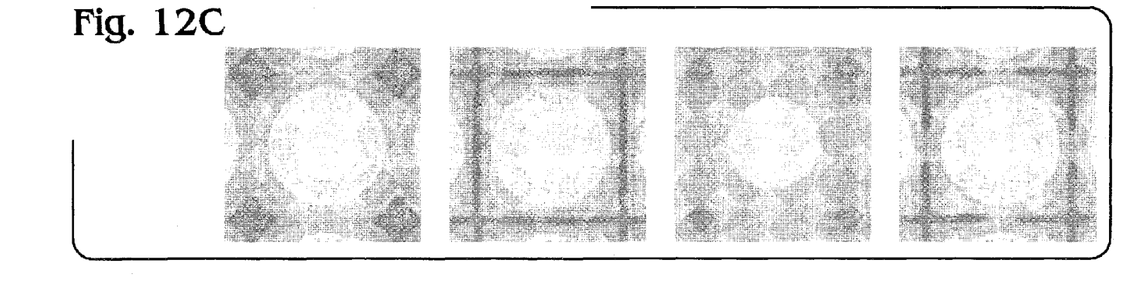

FIGS. 12A, 12B, and 12C depict cross-sectional, plan, and light transmission characteristics, respectively, of a family of microlens (pyramid shaped) grayscale masks. In FIG. 12A, 4 different grayscale masks are shown in cross-section, each comprised of semi-transparent film layers 1200, 1202, 1204, and 1206. Plan (top-down) views of each of the 4 different grayscale masks are shown in FIG. 12B. The top surface of each film layer is depicted as having either a circular or rectangular pattern. However, the masks are not necessarily limited to just these shapes or combination of shapes. FIG. 12C depicts the attenuation parameters of each mask. The white areas in the center of each mask indicate greater attenuation, while the darker areas on the mask edges indicate regions of lesser light attenuation.

Figure 13:
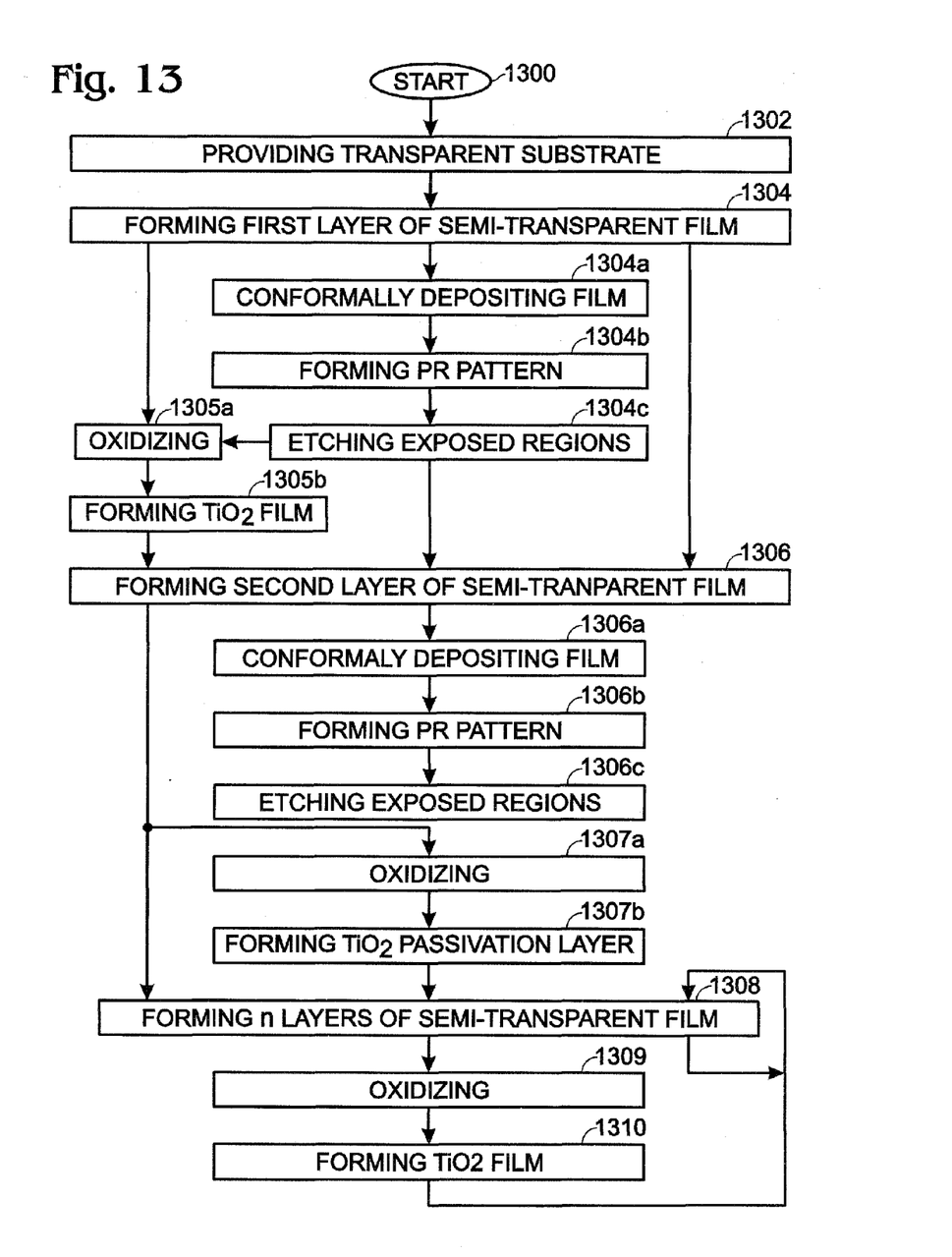
FIG. 13 is a flowchart illustrating a second method for forming a grayscale mask from semi-transparent film layers.

FIG. 13 is a flowchart illustrating a second method for forming a grayscale mask from semi-transparent film layers. Although the method is depicted as a sequence of numbered steps for clarity, the numbering does not necessarily dictate the order of the steps. It should be understood that some of these steps may be skipped, performed in parallel, or performed without the requirement of maintaining a strict order of sequence. The method starts at Step 1300.

Step 1302 provides a transparent substrate with a surface. For example, the substrate may be quartz. Step 1304 forms a first layer of a semi-transparent film having a surface with a first surface area, overlying the substrate surface. Step 1306 forms a second layer of the semi-transparent film having a surface with a second surface area greater than the first surface area, overlying the first layer. Some examples of first and second layer semi-transparent films include Ti, V, Cr, Co, Ni, Zr, Nb, Mo, Tc, Ru, Rh, Pd, Ag, Hf, Ta, Os, Ir, Pt, CrN, $Cr_2O_3$, $MoSi_2$, and Au. As described above, Steps 1304 and 1306 may be used to form a structure (when viewed in cross-section) such as a pyramid, step, or ramp. In some aspects, Step 1308 forms n layers of the semi-transparent film, each having a surface with a unique surface area, overlying the second layer, where n is an integer greater than or equal to 1.

In one aspect, providing the transparent substrate in Step 1302 includes providing a substrate with a light first transmission characteristic. Forming the first and second layers of semi-transparent film in Step 1304 and 1306, respectively, includes depositing a semi-transparent film having a light second transmission characteristic, less than the first transmission characteristic.

In another aspect, Step 1304 forms the first layer of semi-transparent film with a first thickness and a light transmission characteristic responsive to the first thickness. Likewise, Step 1306 forms he second layer of semi-transparent film with a second thickness and a light transmission characteristic responsive to the second thickness.

In one aspect, forming the first layer of semi-transparent film includes substeps. Step 1304a conformally deposits the first layer of semi-transparent film. Step 1304b forms a photoresist pattern overlying the first layer. Step 1304c etches exposed regions of the first layer. Likewise, forming the second layer of semi-transparent film includes substeps. Step 1306a conformally deposits the second layer of semi-transparent film. Step 1306b forms a photoresist pattern overlying the second layer. Step 1306c etches exposed regions of the second layer.

In one aspect, forming the first and second layers of semi-transparent film in Steps 1304 and 1306 includes forming Ti films, each having a thickness in the range of 0.1 to 10 nm. A non-metallic film may have a thickness in the range of 0.3 to 50 nm. Using Ti, Step 1306a may deposit the second layer using an e-beam evaporation process, and Step 1306c may selectively etch the Ti film using about 5% $NH_3OH$ in water. Again, similar substeps may be used to pattern a Ti first layer.

In one aspect, Step 1307a oxidizes the second layer of Ti film and Step 1307b forms a transparent $TiO_2$ passivation layer. In another aspect, Step 1305a oxidizes the first layer of Ti film and Step 1305b forms a transparent $TiO_2$ film interposed between the first and second layers of Ti film. Oxidation or nitrogenation steps may also be performed if materials other than Ti are used in Steps 1304 and 1306. Further, if n semi-transparent film layers are formed (Step 1308), an oxide (or nitride) layer may be interposed between each film layer. Likewise, if n layers are formed (Step 1308), each layer may optionally be oxidized to form an oxidized layer (Steps 1309 and 1310, respectively). Alternately, each layer may be exposed to a nitrogenation process.

Figure 11:
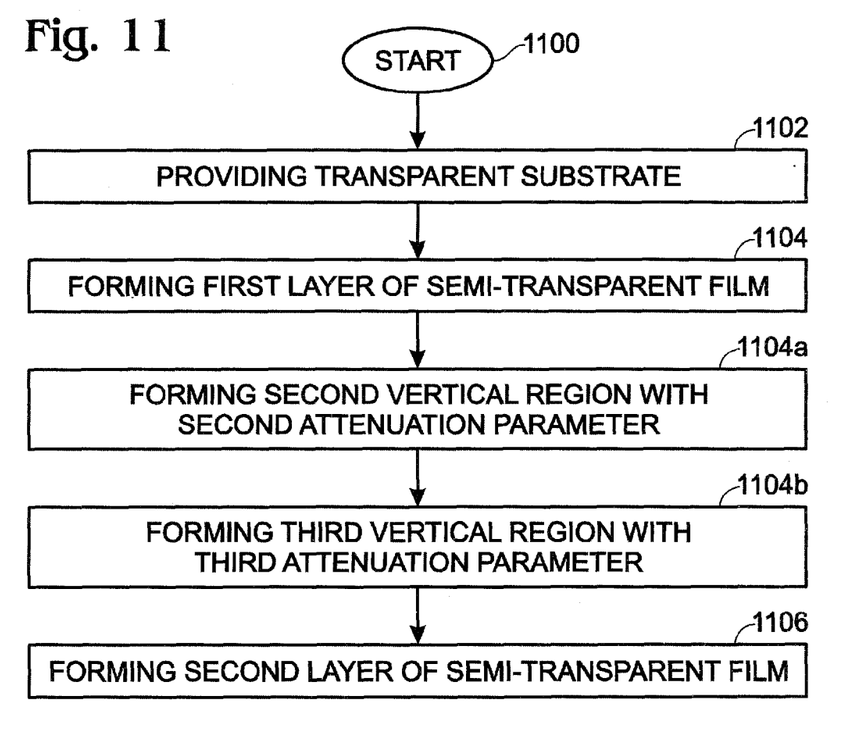
FIG. 11 is a flowchart illustrating a first method for forming a grayscale mask from semi-transparent film layers.

FIG. 11 is a flowchart illustrating a first method for forming a grayscale mask from semi-transparent film layers. Step 1102 provides a transparent substrate with a surface. Step 1104 forms a first layer of a semi-transparent film having a surface with a first surface area, overlying the substrate surface. Step 1106 forms a second layer of the semi-transparent film having a surface with a second surface area greater than the first surface area, overlying the first layer.

In one aspect, forming the second layer of semi-transparent film in Step 1106 includes forming a first vertical region having a light first attenuation parameter through the combination of the substrate, the first layer, and the second layer. Then, forming the first layer in Step 1104 includes substeps. Step 1104a forms a second vertical region having a light second attenuation parameter through the combination of the second layer and the substrate. Step 1104b forms a third vertical region having a light third attenuation parameter through the substrate.

A grayscale mask made from multiple layers of semi-transparent film has been provided, along with an associated fabrication process. Specific structures, shapes, dimensions, and process flows have been given as examples to illustrate the invention. However, the invention is not limited to merely these examples. Other variations and embodiments of the invention will occur to those skilled in the art.

We claim:

1. A method for forming a grayscale mask from semi-transparent film layers, the method comprising:
   providing a transparent substrate with a surface;
   forming a first layer of a semi-transparent film having a surface with a first surface area overlying the substrate surface; and,
   forming a second layer of the semi-transparent film, formed from a single continuous section of film and having a surface with a second surface area greater than the first surface area overlying and in direct contact with the first layer and regions of the transparent substrate adjacent the first layer.

2. The method of claim 1 wherein providing the transparent substrate includes providing a substrate with a light first transmission characteristic; and,
   wherein forming the first and second layers of semi-transparent film includes depositing a semi-transparent film having a light second transmission characteristic, less than the first transmission characteristic.

3. The method of claim 2 wherein forming the second layer of semi-transparent film includes forming a first vertical region having a light first attenuation parameter through the combination of the substrate, the first layer of semi-transparent film, and the second layer of semi-transparent film;
   wherein forming the first layer of semi-transparent film includes:
      forming a second vertical region having a light second attenuation parameter through the combination of the second layer of semi-transparent film and the substrate; and,
      forming a third vertical region having a light third attenuation parameter through the substrate.

4. The method of claim wherein forming the first layer includes forming the first layer of semi-transparent film with a first thickness and a light transmission characteristic responsive to the first thickness; and,
   wherein forming the second layer includes forming the second layer of semi-transparent film with a second thickness and a light transmission characteristic responsive to the second thickness.

5. The method of claim 1 wherein forming the first layer of semi-transparent film includes:
   conformally depositing the first layer of semi-trans film;
   forming a photoresist pattern overlying the first layer; and,
   etching exposed regions of the first layer;
   wherein forming the second layer of semi-transparent film includes:
   conformally depositing the second layer of semi-transparent
   forming a photoresist pattern overlying the second layer and,
   etching exposed regions of the second layer.

6. The method of claim 1 further comprising:
   forming n layers of the semi-transparent film, each having a surface with a unique surface area, overlying the second layer, where n is an integer greater than or equal to 1.

7. The method of claim 1 wherein forming the first and second layers of semi-transparent film includes forming a semi-transparent film selected from a group consisting of Ti, V, Cr, Co, Ni, Zr, Nb, Mo, Tc, Ru, Rh, Pd, Ag, Hf, Ta, Os, Ir, Pt, CrN, $Cr_2O_3$, $MoSi_2$, and Au.

8. The method of claim 1 wherein forming the first and second layers of semi-transparent film includes forming films, each having a thickness in a range of 0.3 to 50 nanometers (nm).

9. The method of claim 1 wherein forming the first and second layers of semi-transparent film includes forming Ti film layers by:
depositing the first and second layer using an e-beam evaporation process; and,
selectively etching the Ti film using about 5% NH$_3$OH in water.

10. The method of claim 9 further comprising:
oxidizing the second layer of Ti film; and,
forming a transparent TiO$_2$ passivation layer.

11. The method of claim 10 further comprising:
oxidizing the first layer of Ti film; and,
forming a transparent TiO$_2$ film interposed between the first and second layers of Ti film.

12. The method of claim 1 wherein pro ding the transparent substrate includes providing a quartz substrate.

13. The method of claim 1 wherein forming the first and second layers of semi-transparent film includes forming a structure selected from a group consisting of a pyramid, step, and ramp.

14. The method of claim 1 wherein forming the first layer of semi-transparent film includes forming a first layer of Ti film, where the first layer of Ti film has a light transmission characteristic that varies in a range between 19% and 23%, at wavelengths in the range between 400 nanometers (nm) and 700 nm, when the first layer of Ti film has a thickness of 10 nm; and,
wherein forming the second layer of the semi-transparent film includes forming a second layer of Ti film, where the second layer of Ti film has a light transmission characteristic that varies in the range between 19% and 23%, at wavelengths in the range between 400 nm and 700 nm, when the second layer of Ti film has a thickness of 10 nm.

15. A grayscale mask of semi-transparent film layers, the mask comprising:
a transparent substrate with a surface;
a first layer of a semi-transparent film having a surface with a first surface area overlying the substrate surface; and,
a second layer of the semi-transparent film, formed from a single continuous section of film and having a surface with a second surface area greater than the surface area overlying and in direct contact with the first layer and regions of the transparent substrate adjacent to the first layer.

16. The mask of claim 15 wherein the transparent substrate material has a light first transmission characteristic; and,
wherein the first and second layers of semi-transparent film material have a light second transmission characteristic, less than the first transmission characteristic.

17. The mask of claim 16 wherein the first and second layers of semi-transparent film form:
a first vertical region having a light first attenuation parameter through the combination of the substrate, the first layer of semi-transparent film, and the second layer of semi-transparent film;
a second vertical region having a light second attenuation parameter through the combination of the second layer of semi-transparent film and the substrate; and,
a third vertical region having a light third attenuation parameter the substrate.

18. The mask of claim 17 wherein the first layer of semi-transparent film has a first thickness and a light transmission characteristic responsive to the first thickness; and,
wherein the second layer of semi-transparent film has a second thickness and a light transmission characteristic responsive to the second thickness.

19. The mask of claim 15 wherein the first and second layers of semi-transparent film are a material selected from a group consisting of Ti, V, Cr, Co, Ni, Zr, Nb, Mo, Tc, Ru, Rh, Pd, Ta, Os, Ir, Pt, CrN, Cr$_2$O$_3$, MoSi$_2$, and Au.

20. The mask of claim 15 wherein the first and second layers of semi-transparent films each have a thickness in a range of 0.3 to 50 nanometers (nm).

21. The mask of claim 15 wherein the first and second layers of semi-transparent films are Ti;
the mask further comp sing:
a transparent TiO$_2$ passivation layer overlying the second layer of Ti film.

22. The mask of claim 21 further comprising:
a transparent TiO$_2$ interposed between the first and second layers of Ti film.

23. The mask of claim 15 wherein the transparent substrate is quartz.

24. The mask of claim 15 further comprising:
n layers of the semi-transparent film, each having a surface with a unique surface area, overlying the second layer, where n is an integer greater than or equal to 1.

25. The mask of claim 15 wherein the first and second layers of semi-transparent film form a structure selected from a group consisting of a pyramid, step, and ramp.

26. The mask of claim 15 wherein the first layer of semi-transparent film is a first layer of Ti film, where the first layer of Ti film has a light transmission characteristic that varies in a range between 19% and 23%, at wavelengths in the range between 400 nanometers (nm) and 700 nm, when the first layer of Ti film has a thickness of 10 nm; and,
wherein the second layer of the semi-transparent film is a second layer of Ti film, where the second layer of Ti film has a light transmission characteristic that varies in the range between 19% and 23%, at wavelengths in the range between 400 nm and 700 nm, when the second layer of Ti film has a thickness of 10 nm.

* * * * *

UNITED STATES PATENT AND TRADEMARK OFFICE
CERTIFICATE OF CORRECTION

| | | |
|---|---|---|
| PATENT NO. | : 8,685,596 B2 | Page 1 of 1 |
| APPLICATION NO. | : 11/950196 | |
| DATED | : April 1, 2014 | |
| INVENTOR(S) | : Wei Gao, Bruce Ulrich and Yoshi Ono | |

It is certified that error appears in the above-identified patent and that said Letters Patent is hereby corrected as shown below:

In the Claims

In claim 4, column 8, line 34, the claim dependency has been omitted. Claim 4 depends from claim 1, and should be printed as follows:
4. The method of claim 1 wherein forming the first layer includes forming the first layer of semi-transparent film with a first thickness and a light transmission characteristic responsive to the first thickness; and,
   wherein forming the second layer includes forming the second layer of semi-transparent film with a second thickness and a light transmission characteristic responsive to the second thickness.

In claim 15, column 9, line 44, the word "first" has been omitted before the second occurrence of the word "surface". Claim 15 should be printed as follows:
15. A grayscale mask of semi-transparent film layers, the mask comprising:
   a transparent substrate with a surface;
   a first layer of a semi-transparent film having a surface with a first surface area overlying the substrate surface; and,
   a second layer of the semi-transparent film, formed from a single continuous section of film and having a surface with a second surface area greater than the first surface area overlying and in direct contact with the first layer and regions of the transparent substrate adjacent to the first layer.

In claim 19, column 10, line 20, two elements in a recited Markush group have been omitted - namely, "Ag" and "Hf". Claim 19 should be printed as follows:
19. The mask of claim 14 wherein the first and second layers of semi-transparent film are a material selected from a group consisting of Ti, V, Cr, Co, Ni, Zr, Nb, Mo, Tc, Ru, Rh, Pd, Ag, Hf, Ta, Os, Ir, Pt, CrN, Cr2O3, MoSi2, and Au.

Signed and Sealed this
Tenth Day of June, 2014

Michelle K. Lee
*Deputy Director of the United States Patent and Trademark Office*